United States Patent
Shimizu

(10) Patent No.: US 9,628,907 B2
(45) Date of Patent: Apr. 18, 2017

(54) AUDIO DEVICE AND METHOD HAVING BYPASS FUNCTION FOR EFFECT CHANGE

(71) Applicant: Yamaha Corporation, Hamamatsu-shi, Shizuoka-ken (JP)

(72) Inventor: Atsushi Shimizu, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 151 days.

(21) Appl. No.: 14/525,261

(22) Filed: Oct. 28, 2014

(65) Prior Publication Data

US 2015/0125001 A1    May 7, 2015

(30) Foreign Application Priority Data

Nov. 1, 2013   (JP) .................................. 2013-227921

(51) Int. Cl.
| | | |
|---|---|---|
| *H04B 15/00* | (2006.01) | |
| *H04R 3/00* | (2006.01) | |
| *H03G 3/30* | (2006.01) | |
| *H03G 3/34* | (2006.01) | |

(52) U.S. Cl.
CPC .............. *H04R 3/00* (2013.01); *H03G 3/301* (2013.01); *H03G 3/348* (2013.01); *H04R 2430/01* (2013.01)

(58) Field of Classification Search
USPC .... 381/94.2, 98, 102, 107, 119, 312; 700/94
See application file for complete search history.

(56) References Cited

U.S. PATENT DOCUMENTS

| 5,896,459 A * | 4/1999 | Williams, Jr. ......... H04H 60/04 381/119 |
| 7,286,675 B1 * | 10/2007 | O'Neill .............. A61N 1/36032 381/102 |
| 2002/0076072 A1 * | 6/2002 | Cornelisse ............. H03G 7/007 381/312 |
| 2008/0049950 A1 * | 2/2008 | Poletti ...................... H04R 3/00 381/94.2 |
| 2009/0274322 A1 * | 11/2009 | Chang ...................... H03G 9/14 381/107 |

(Continued)

FOREIGN PATENT DOCUMENTS

| JP | 7-69690 B2 | 7/1995 |
| JP | 8-30271 A | 2/1996 |

*Primary Examiner* — Vivian Chin
*Assistant Examiner* — Friedrich W Fahnert
(74) *Attorney, Agent, or Firm* — Crowell & Moring LLP

(57) ABSTRACT

When an effect parameter of an effector is changed, if only a switching operation is provided to bypass the original audio signals, which are input signals of the effector, during the period required for making that change, the output sound level may drastically change before and after the switching causing one to feel a sense of discomfort. In order to eliminate such a drawback, a gain adjustment circuit is provided in a bypass channel that outputs the original audio signals by bypassing the effector. The gain adjustment circuit is controlled in accordance with a rate of the output signal level of the effector and the original audio signal level, and the output signal level of the bypass channel is adjusted thereby. Consequently, a fluctuation in the output sound level before and after switching of the output signals can be eliminated.

12 Claims, 3 Drawing Sheets

(56) References Cited

U.S. PATENT DOCUMENTS

2011/0160883 A1\* 6/2011 Yasuda .................. H04R 3/14
                                                                                               700/94
2013/0177170 A1\* 7/2013 Aylward ................ H03G 5/165
                                                                                               381/98

\* cited by examiner

AUDIO DEVICE AND METHOD HAVING BYPASS FUNCTION FOR EFFECT CHANGE

BACKGROUND

The present invention relates to an audio device that processes and adds various effects to audio signals including tone signals of an electronic musical instrument, an electric guitar, and the like, and more particularly to an improvement of a bypass function for outputting original audio signals by temporarily bypassing an effector when an effect parameter is changed.

Conventionally, there have been employed audio devices, which process tone signals or audio signals of such tone signals in a broad sense in electronic musical instruments, electric guitars, and the like, or in guitar amplifiers or the like, and which impart various effects to those signals (may be simply referred to as the "effector" hereinafter). In such effectors, various tonal or audio effects can be selected from among distortion that distorts sound, reverb that adds reverberation effect, echo that adds delay to the original sound such that the original sound is repeated as it fades away in a distance like an "echo," flanger that modulates the quality of the original sound (frequency distribution), wahwah that transmits frequency components of only a specific range so as to make a sound boxy or clear, and the like, while settings of parameters of the respective effects can be changed at any time. Such effects are selected and set, as needed, by an artist or the like for various purposes such as improving sound quality of the original sound and enhancing the live feel.

This type of effector is usually configured by digital signal processing such as a DSP, and in the case of switching a type of effect to be imparted, changing a value of a parameter in the effect, or the like, it is necessary to execute such a process as clearing stored data or redoing an operation. Such a process carried out for making the change require a certain amount of time, during which the sound may be interrupted or unpleasant noise may be generated. That is, just changing the parameter value discontinuously and largely results in generation of noise, even if the type of effect are not switched. Also, in the case of a delay-type effect, an audio signal for a plurality of samples are stored in a storage device called "delay line," such that data for the plurality of samples in the delay line need to be initialized when an effect changing process is performed, and therefore a selected effect does not function properly during a certain amount of time. In addition, the effect does not function properly for a certain amount of time at the time of replacement of the microcode that is executed by the DSP during the effect changing process. It is not preferable that sound is interrupted or noise is generated during the effect changing process.

To deal with this problem, conventionally, as disclosed in Japanese Patent Publication No. Hei 7-69690 (hereinafter referred to as Patent Literature 1), a bypass channel that outputs an original audio signal by bypassing a signal processing circuit for performing effect processing is provided so that the audio signal is output from the bypass channel during a time period required for the effect changing process, and after the time period has terminated a source of an audio signal to be output is switched back to the signal processing circuit. Accordingly, interruption of sound and generation of unpleasant noise are prevented from occurring during the period when the effect changing process is carried out.

Further, Japanese Unexamined Patent Application Publication No. Hei 8-30271 (hereinafter referred to as Patent Literature 2) discloses an effector, similarly to the aforementioned Patent Literature 1, in which, in addition to a bypass channel that outputs an original audio signal without passing through a signal processing circuit for performing effect processing (a filter and a reverberator in FIG. 1 of the Patent Literature 2), an adder for adding signals output via the filter or reverberator to the signal output via the bypass channel is further provided. In this effector, it is determined whether the effect changing process leads to generation of noise, and if it is determined that the effect changing process does lead to generation of noise, an output signal output through the filter and reverberator is controlled to prevent unpleasant noise that is generated during the effects changing process from being output.

In the above-described Patent Literatures 1 and 2, some improvement can be seen in terms of interruption of sound and generation of noise during the effect changing process. However, sense of discomfort one feels may be increased in some cases by adopting only a configuration in which the output signal is switched from the signal output via the signal processing circuit for performing effect processing to the signal output via the bypass channel instead of the signal processing circuit, during the period required for the effect changing process.

The tonal or audio effects, described above, include distortion, reverb, echo, flanger, and the like. In the case of a type change between effect types which does not involve a noticeable change in terms of signal levels and frequency characteristics after adding an effect to the original sound, such as the delay-type effects including reverb and echo, for example, problems many not arise even if switching of the output signals is merely performed as mentioned above. However, switching the signals, as mentioned above is not enough in the case where a tone volume is set within the signal processing circuit or in the case where an equalizer is set to be used. That is, in the case where the tone volume is set within the signal processing circuit or in the case where an equalizer is set to be used, one may feel a sense of much discomfort if a large sound is suddenly output as a result of switching from the signal output via the effects processing to the original audio signal output via the bypass channel.

Further, in the case of a type change between effect types such as distortion-type effects and wahwah, which are subject to a drastic change in signal levels and frequency characteristics, as compared to the original sound, after effects are imparted thereto, and particularly in the case of a type change between two effect types that results in a reduced volume in terms of a sense of hearing, one may feel a sense of much discomfort if a large sound is suddenly output as a result of switching from the signal output via the effects processing to the original audio signal output via the bypass channel.

SUMMARY OF THE INVENTION

In view of the abovementioned prior art problems, it is an object of the present invention is to provide an improved audio device and method that allows changing of the effects without causing an output volume change, which leads to a sense of discomfort, no matter how the effects are changed.

In order to accomplish the above-mentioned object the present invention provides an improved audio device which comprises: an audio signal processor configured to process an original audio signal input thereto to impart at least one of various effects to the input audio signal, and output the processed audio signal; a bypass channel configured to transfer the original audio signal without being processed by the audio signal processor; a gain adjustment circuit provided in the bypass channel; a gain setting circuit configured to set a gain of the gain adjustment circuit in accordance with a ratio of input and output signal levels of the audio signal processor; and an output controller configured to select output signals from at least one of the audio signal processor and the bypass channel.

According to the present invention, the gain adjustment circuit is provided in the bypass channel, and the gain of the gain adjustment circuit is set in accordance with the ratio of input and output signal levels of the audio signal processor. Consequently, it is possible to control the output signal level of the bypass channel, gain of which has been adjusted by the gain adjustment circuit, to an appropriate level that matches the output signal level of the audio signal processor. Accordingly, when an effect is changed, in the case where the output signals to be selected by the output controller is temporarily switched between the audio signal processor and the bypass channel, a control may be performed such that the level of the output signals does not fluctuate unnaturally before and after the switching. Thus, drawbacks such as the sense of discomfort caused by a sudden generation of a loud sound during the switching can be eliminated. Accordingly, it is possible to change the effects without generating an output volume change that causes a sense of discomfort, no matter how the effects are changed.

According to one embodiment, the gain setting circuit may set a gain of the gain adjustment circuit so that a sound pressure level of an output signal output from the bypass channel, for which gain adjustment has been made by the gain adjustment circuit, approaches a sound pressure level of an output signal output from the audio signal processor.

According to one embodiment, the output controller may normally select sn output signal of the audio signal processor, while the output controller may temporarily select an output signal of the bypass channel instead of the output signal of the audio signal processor when the audio signal processor is given an effect change command.

According to one embodiment, the output controller may be configured to gradually switch the output signal to be selected by performing cross-fade synthesis when the output signal to be selected is switched from the output signals of the audio signal processor to the output signals of the bypass channel, or vice versa.

According to one embodiment, the gain setting circuit may include a weighting circuit having frequency characteristics corresponding to the equal-loudness curve, and may set the gain of the gain adjustment circuit of the bypass channel in accordance with a rate of levels of first and second signals, the first signal having been obtained by processing the original audio signal by means of the weighting circuit, the second signal having been obtained by processing an output signal of the audio signal processor by means of the weighting circuit. Accordingly, adjustment of the output signal level of the bypass channel can be more consistent with the sense of hearing of human beings, thus fluctuation in the output sound level before and after the switching can be further improved in terms of sense of hearing.

The present invention may be constructed and implemented not only as the apparatus invention discussed above but also as a method invention. Also, the present invention may be arranged and implemented as a software program for execution by a processor, such as a computer or DSP, as well as a non-transitory computer-readable storage medium storing such a software program. In this case, the program may be provided to a user in the storage medium and then installed into a computer of the user, or delivered from a server apparatus to a computer of a client via a communication network and then installed into the client's computer. Further, the processor used in the present invention may comprise a dedicated processor with dedicated logic built in hardware, not to mention a computer or other general-purpose processor capable of running a desired software program.

The following will describe embodiments of the present invention, but it should be appreciated that the present invention is not limited to the described embodiments and various modifications of the invention are possible without departing from the basic principles. The scope of the present invention is therefore to be determined solely by the appended claims.

BRIEF DESCRIPTION OF THE DRAWINGS

Certain preferred embodiments of the present invention will hereinafter be described in detail, by way of example only, with reference to the accompanying drawings, in which.

DETAILED DESCRIPTION

Embodiments of the present invention will be described hereinafter in detail with reference to the attached drawings.

Figure 1:
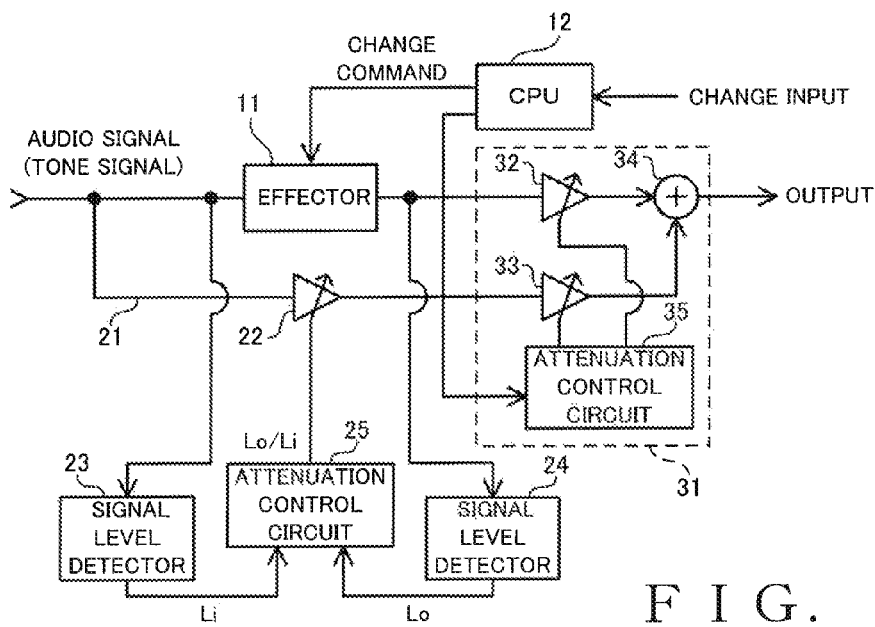
FIG. 1 is a block diagram illustrating an audio device according to one embodiment of the present invention.

FIG. 1 illustrates an audio device according to one embodiment of the present invention. As shown in FIG. 1, this audio device is provided with an effector 11 (i.e., an audio signal processor) that imparts at least one of various types of tonal or audio effects such as distortion, reverb, echo, and flanger to an audio signal such as a digitally generated tone signal and that outputs the audio signal thus obtained. The audio signal thus imparted thereto a desired effect or effects is output from a loudspeaker as an acoustic sound via an audio amplifier or the like (not shown).

A user such as a music artist or the like operates a dial, a button, and the like, while listening to the sound with one's own ears, to change an effect type to another or to change various parameters. When an instruction for a change is input to a CPU 12 through operation of the dial or the like, a command is output from the CPU 12 to change the effect type or any of the various parameters for the effector 11.

A bypass channel 21 that bypasses the effector 11 is provided. A variable attenuator (namely a variable gain circuit) 22 is inserted in the bypass channel 21 to adjust a signal level of signals output via the bypass channel 21. The variable attenuator 22 is a gain adjustment circuit provided in the bypass channel 21.

An audio signal output from the effector 11 (namely, an effect-imparted audio signal) and an audio signal output via the bypass channel 21 (namely, a non-effect-imparted audio signal or original audio signal) are selectively switched by a cross-fade circuit 31 to be output therefrom. The cross-fade circuit 31 is made up of a variable attenuator (or a variable gain circuit) 32 that adjusts a level of the audio signal output from the effector 11, a variable attenuator (or a variable gain circuit) 33 that adjusts a level of the audio signal output from the bypass channel 21, an adder 34 that adds together the output signals of the variable attenuators 32 and 33 from the effector 11 and the bypass channel 21, and an attenuation control circuit 35 that controls respective amounts of attenuation in the respective variable attenuators 32 and 33. The cross-fade circuit 31 functions as an output controller that is configured to select output signals from at least one of the audio signal processor (effector 11) and the bypass channel 21.

Further, the cross-fade circuit 31 functions as an output controller that is configured to normally select an output signal of the audio signal processor (effector 11), whereas that is configured to temporarily select an output signal of the bypass channel 21 instead of the output signals from the audio signal processor (effector 11) when the audio signal processor (effector 11) is given an effect change command. Further, the cross-fade circuit 31 functions as an output controller that is configured to gradually switch the output signal to be selected by performing cross-fade synthesis when the output signal to be selected is switched from the output signal of the audio signal processor (effector 11) to the output signal of the bypass channel 21, or vice versa.

Further, the input signal and the output signal of the effector 11 are input, respectively, to signal level detectors 23 and 24, and respective signal levels Li and Lo are detected thereby. The detected signal levels Li, Lo are input to an attenuation control circuit 25 in order to obtain a ratio Lo/Li thereof, and the variable attenuator 22 inserted in the bypass channel 21 is controlled in accordance with the ratio Lo/Li of the signal levels Li, Lo obtained by the attenuation control circuit 25. The signal level detectors 23, 24 and the attenuation control circuit 25 function as a gain setting circuit that sets a gain of the gain adjustment circuit (variable attenuator 22) in accordance with a ratio of the input and output signal levels of the audio signal processor (effector 11). In one embodiment, by setting the gain of the variable attenuator 22 (gain adjustment circuit) to a value substantially equal to the ratio Lo/Li, a control may be performed so that the level of the output signal of the bypass channel 21, whose gain is adjusted by the variable attenuator 22, is substantially equal to the level of the output signal of the audio signal processor (effector 11). In another embodiment, the gain of the variable attenuator 22 does not necessarily have to be substantially equal to the ratio Lo/Li, but instead may be set to a similar value. That is, it is sufficient as long as the gain setting circuit (23, 24, 25) is configured to set the gain of the gain adjustment circuit (variable attenuator 22) so that a sound pressure level of an output signal output from the bypass channel 21, for which gain adjustment has been made by the gain adjustment circuit (variable attenuator 22), approaches a sound pressure level of an output signal output from the audio signal processor (effector 11).

Next, operation of the embodiment will be described with reference to the time charts of FIGS. 2A and 2B. First, in the effector 11, suppose that a distortion-type effect is selected, for example, and the sound pressure level of the signal output from the effector 11 as a result of effect processing is at a rate of approximately "25%" with respect to the input signal level, as can be seen immediately before time t1 in FIG. 2A (on the left side in the figure). Suppose that an input to change the effect is given to the CPU 12 through the operation of a dial, or the like when an audio signal having the distortion effect imparted thereto are being output.

At this time, a change processing command is given to the effector 11 from the CPU 12, and a change processing of the parameters and the like begin so as to realize the effect processing that has been commanded. At the same time, a command is given from the CPU 12 to the attenuation control circuit 35 of the cross-fade circuit 31, and the variable attenuators 32 and 33 are controlled by the attenuation control circuit 35 in such a manner that the output level of the effector 11 starts to gradually drop at time t1 shown in FIG. 2A and the output level of the bypass channel 21 starts to gradually rise at the same time.

In this way, before time t1, the variable attenuator 33 is in a state where a degree of attenuation thereof is at its maximum and no signal can pass therethrough, whereas the variable attenuator 32 is in a state where a degree of attenuation thereof is at its minimum and no attenuation occurs (that is, the output level is the same as the level of the input signal). In other words, only the output signals of the effector 11 are being output through the cross-fade circuit 31. In this state, when a change processing command is given at time t1, the output from the effector 11 begins to decrease at time t1 while the output from the bypass channel 21 begins to increase at time t1. Such processes for increase and decrease are terminated at time t2, and from time t2 on, the output from the effector 11 is completely suppressed and therefore the output from the bypass channel 21 is directly output at the level thereof.

In this case, as mentioned earlier, it is assumed that the sound pressure level of the output signal of the effector 11 prior to the changing process is at the rate of "25%," the ratio of the input signal level Li to the output signal level Lo of the effector 11 that has been detected by the signal level detectors 23, 24 is Lo/Li=0.25. Since the attenuation control circuit 25 controls the variable attenuator 22 in accordance with this ratio Lo/Li, the variable attenuator 22 is to be controlled so that the original audio signal input to the variable attenuator 22 is attenuated down to 25%. Accordingly, the output from the bypass channel 21 is attenuated down to 25% of the original audio signal, the output from the cross-fade circuit 31 (output of the adder 34) at time t2 is an original audio signal (input signal of the effector 11) which has been attenuated down to 25%, which is the same as the output signal level of the adder 34 prior to t1 (that is, output signal level of the effector 11).

Further, during the transitional period between t1 and t2, the variable attenuators 32, 33 are controlled by the attenuation control circuit 35 so that a decreasing amount of signal level on one hand and an increasing amount of signal level on the other hand become equal. Accordingly, the output level after combined by the adder 34 is the same during this period between t1 and t2 without any fluctuation.

At time t3, the changing process in the effector 11 is terminated, and at this point, processing of switching the output from the bypass channel 21 to the original effector 11 is started. Due to a control performed by the attenuation control circuit 35, the degree of attenuation of the variable attenuator 32 gradually decreases (output increases) while the degree of attenuation of the variable attenuator 33 gradually increases (output decreases) after t3. At time t4, the degree of attenuation of the variable attenuator 32 becomes zero (no attenuation) and the degree of attenuation of the variable attenuator 33 becomes the maximum (a state where the signal is entirely blocked). After time t4 and on, the output of the effector 11 is directly output through the cross-fade circuit 31. In FIG. 2A, it is assumed, as an example, that the sound pressure level of the output signal after a changing process in the effector 11 corresponds to a rate of approximately "30%." During the transitional period between t3 and t4, the output level of the adder 34 changes smoothly from the sound pressure level of the output signals before the changing process to the sound pressure level of the output signals after the change processing.

Figure 2A:
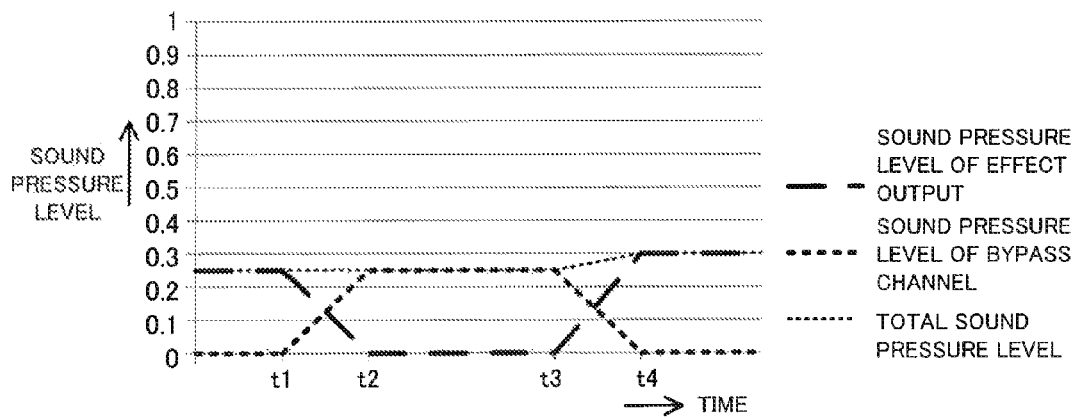
FIGS. 2A and 2B are time charts illustrating time transitions of output sound pressure levels in the embodiment shown in FIG. 1.
Figure 2B:
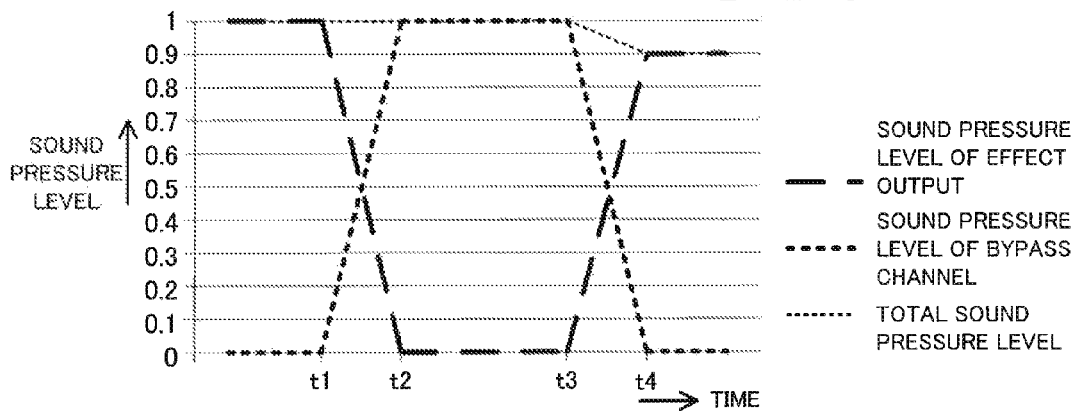

While FIG. 2A shows an example wherein the output signal level of the effector 11 before the change processing is at a rate of approximately 25% of the input signal level thereof, the case where the output signal level of the effector 11 is at the rate of approximately 100% of the input signal level will be as shown in FIG. 2B. In this case, the ratio of the output signal level to the input signal level Lo/Li of the effector 11 becomes Lo/Li=1. Accordingly, the degree of attenuation of the variable attenuator 22 inserted in the bypass channel 21 is controlled at zero (no attenuation). Consequently, after termination of the transitional period between t1 and t2, from time t2, a bypass output at the same level as the output at or before t1 is output instead of the output from the effector 11. This continues until time t3 at which the changing process time of the effector 11 terminates. Fluctuation in the output from the cross-feed circuit 31 (adder 34) is controlled at the time of switching from the effector 11 output to the bypass output (from t1 to t3 via t2).

In this case as well, as shown in FIG. 2B, the output of signals will shift to the output from the effector 11 after the changing process via the transitional period between t3 and t4, after the lapse of changing process time of the effector 11. In FIG. 2B, it is assumed, as an example, that the sound pressure level of the output signal after the changing process in the effector 11 corresponds to a rate of approximately "90%."

Figure 3:
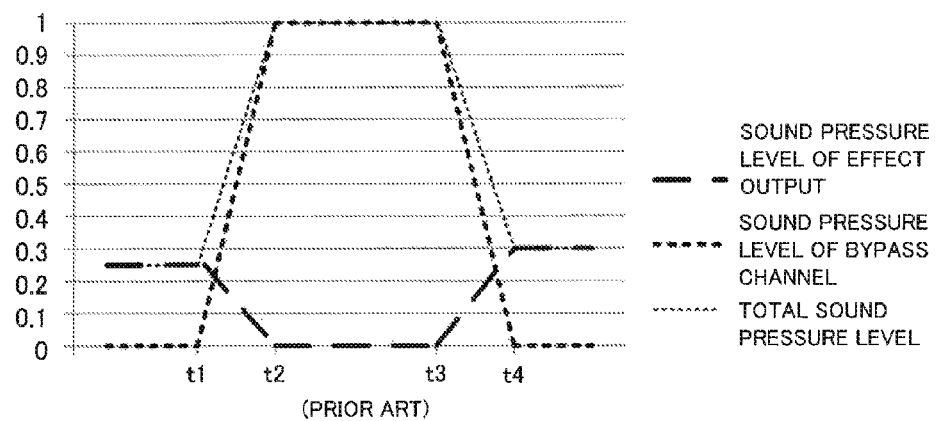
FIG. 3 is a time chart illustrating a time transition of output sound pressure levels of a reference example supposing that a variable attenuator, signal level detectors, and an attenuation control circuit are not provided in the embodiment shown in FIG. 1.

Next, supposing that, as in a conventional example, the configuration is such that the variable attenuator 22 is not provided in the bypass channel 21 and the degree of attenuation of the variable attenuator 22 is not controlled in accordance with a ratio Lo/Li of the output/input signal levels of the effector 11, and taking such a case as a reference example, the output sound level will fluctuate much as shown in FIG. 3. That is, if a selection of effect is made for the effector 11 before the changing process in such a manner that the output level therefrom will be at the rate of 25% with respect to the original audio signal input to the effector 11, at the termination of the transitional period between t1 and t2 (at t2), the output signal from the bypass channel 21 (that is, the original audio signal that is input to the effector 11) is directly output from the cross-fade circuit 31 (adder 34) as is. This means that 100% of the input signal (original audio signal) level input to the effector 11 is output, causing the sound pressure level to drastically change from 25% to 100%.

In addition, after the transitional period between t3 and t4, during which an output route is changed from the bypass channel 21 to the effector 11 (after t4), the output sound level changes drastically, for example, from 100% to 30%.

As described above, according to the aforementioned embodiment of the present invention (FIG. 1), a fluctuation in the signal level at the time of switching the signals, as seen in the abovementioned reference example (conventional example such as FIG. 3) can be controlled.

Figure 4:
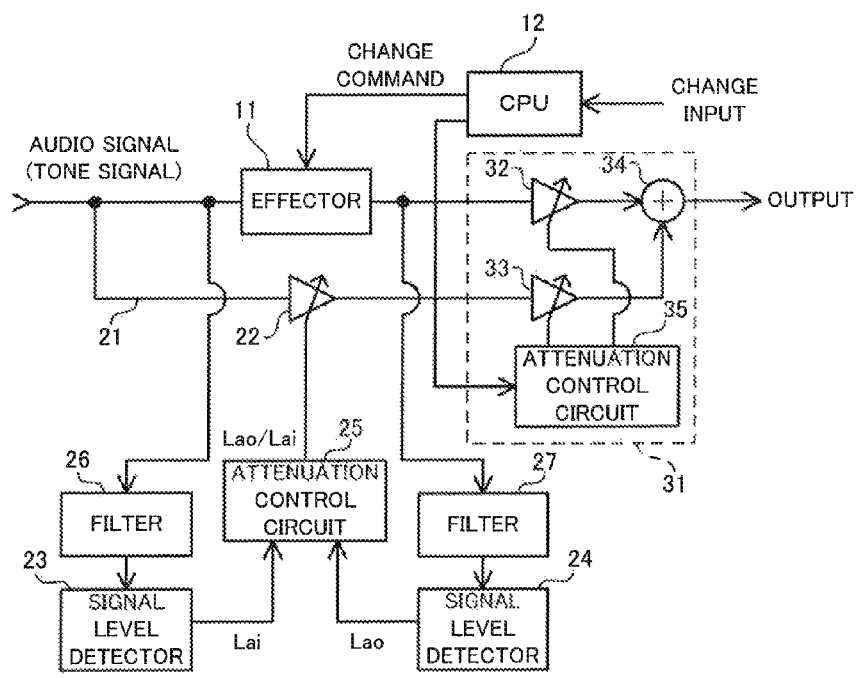
FIG. 4 is a block diagram illustrating an audio device according to another embodiment of the present invention.

A second embodiment will now be described with reference to FIG. 4. In the configuration shown in FIG. 4, filters 26 and 27 have been added to the configuration shown in FIG. 1, which is the only point that differs from the configuration of FIG. 1. Accordingly, only description of operation and advantages of the filters 26, 27 will be given hereinafter, and the description of parts in common with those shown in FIG. 1 will be omitted.

The filters 26 and 27 are formed by, for example, IIR filters, that function as filter circuits that perform weighting in accordance with "A weighted sound pressure level" corresponding to the equal-loudness curve (refer to ISO226). An input signal (original audio signal) to the effector 11 is transmitted to the signal level detector 23 via the filter 26, whereby a signal level Lai of the input signal is detected. Similarly, an output signal (signal after the effect processing) of the effector 11 is transmitted to the signal level detector 24 via the filter 27, whereby a signal level Lao of the output signal is detected. The attenuation control circuit 25 controls the variable attenuator 22 in accordance with the output/input level ratio Lao/Lai. The filters 26, 27 function as a weighting circuit having frequency characteristics corresponding to the equal-loudness curve.

Figure 5:
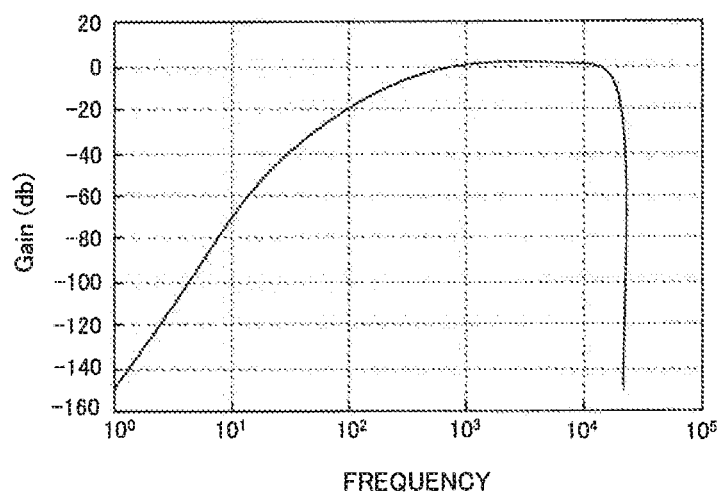
FIG. 5 is a graph illustrating an A weighted sound pressure level.

As can be seen, instead of controlling the attenuator 22 simply by the output/input level ratio Lo/Li as shown in FIG. 1, the variable attenuator 22 is controlled in accordance with the output/input level ratio Lao/Lai of the effector 11 via the filters 26, 27. Accordingly, adjustment of output sound level that is more consistent with the sense of hearing of human beings is possible, and fluctuation in the output sound level in terms of sense of hearing is controlled. The A weighted sound pressure level corresponding to the equal-loudness curve is as shown in FIG. 5, which takes into consideration the characteristic of human sense of hearing that is characterized by the fact that a sound of the same sound level sounds differently depending on the frequency thereof. Therefore, even if the frequency distribution may become different from the original audio signal before imparting the effect, a control that allows a sound to be perceived as a sound of the same level is possible in terms of the sense of hearing, when the original audio signal and the signal with an effect imparted thereto are switched, thereby further eliminating a sense of discomfort.

While embodiments have heretofore been described, it should be noted that the present invention can be widely applied to audio devices substantially having an effector such as a guitar amplifier. Further, the present invention can be applied to not only a stand-alone audio device provided with an effector but also electronic musical instruments and other electronic music devices having a built-in effector function. Further, there are cases where effectors are provided in PA products (public audio devices in halls or the like), and the present invention can be applied to such cases for solving a similar problem that occurs during switching of an audio connection.

While in the abovementioned embodiment, as an example of effects changing process command, description has been given for the case where instructions to change parameters or types are given in the state while a distortion type effect is selected, the present invention is not limited thereto and can therefore be applied to various forms of effects changing processes. In addition, the present invention can be applied to a case where a plurality of effect settings set in accordance with a desired effect type, parameters, and the like of a user are stored in advance and one arbitrary set of effect settings is selected to change the settings in one operation. Still further, the set of abovementioned effect settings is not limited to one that consists solely of the effect settings, but may also include other musical sound or audio settings such as a tone setting for a sound source function, and such settings may be stored together with the effect settings, as a set, and be selectively called up. Also, automatic playing data may include the effect setting data such that an effects changing process command is issued at an appropriate timing automatically in accordance with the progress of the automatic playing and the effects changing process is carried out in accordance with the effect setting data. In addition, the audio device according to the present invention (or a music-related apparatus such as an electronic musical instrument that contains the audio device therein) may communicate with an external device such that an effects changing process command is given in accordance with instruction signals from the external device.

This application is based on, and claims priority to, JP PA 2013-227921 filed on 1 Nov. 2013. The disclosure of the priority application, in its entirety, including the drawings, claims, and the specification thereof, are incorporated herein by reference.

What is claimed is:

1. An audio device comprising:
    an audio signal processor configured to process an original audio signal input thereto to impart at least one of various effects to the input audio signal, and output the processed audio signal;
    a bypass channel configured to transfer the original audio signal without being processed by the audio signal processor;
    a gain adjustment circuit provided in the bypass channel;
    a gain setting circuit configured to set a gain of the gain adjustment circuit in accordance with a ratio of input and output signal levels of the audio signal processor; and
    an output controller configured to select output signals from at least one of the audio signal processor and the bypass channel, and
    wherein the output controller normally selects an output signal of the audio signal processor, while the output controller temporarily selects an output signal of the bypass channel instead of the output signal of the audio signal processor when the audio signal processor is given an effect change command.

2. The audio device according to claim 1, wherein the gain setting circuit is configured to set the gain of the gain adjustment circuit so that a sound pressure level of an output signal output from the bypass channel, for which gain adjustment has been made by the gain adjustment circuit, approaches a sound pressure level of an output signal output from the audio signal processor.

3. The audio device according to claim 1, wherein the gain setting circuit is configured to set the gain of the gain adjustment circuit in accordance with a ratio between a level of the original audio signal and a level of an output signal output from the audio signal processor.

4. The audio device according to claim 1, wherein the output controller is configured to gradually switch the output signal to be selected by performing cross-fade synthesis when the output signal to be selected is switched from the output signal of the audio signal processor to the output signals of the bypass channel, or vice versa.

5. The audio device according to claim 1, wherein the gain setting circuit includes:
    a detector configured to detect an output signal level of the audio signal processor and an original audio signal level; and
    a circuit configured to obtain a ratio of the detected output signal level of the audio signal processor and the original audio signal level.

6. The audio device according to claim 1, wherein the gain setting circuit is configured to set the gain of the gain adjustment circuit in accordance with a ratio of levels of first and second signals, the first and second signals having been obtained by filtering input and output signals of the audio signal processor according to frequency characteristics corresponding to an equal-loudness curve respectively.

7. The audio device according to claim 1, wherein the gain setting circuit includes a weighting circuit having frequency characteristics corresponding to an equal-loudness curve, and
    wherein the gain setting circuit sets the gain of the gain adjustment circuit of the bypass channel in accordance with a rate of levels of first and second signals, the first signal having been obtained by processing the original audio signal by means of the weighting circuit, the second signal having been obtained by processing an output signal of the audio signal processor by means of the weighting circuit.

8. A computer-implemented method for processing audio signals using an audio signal processor which is configured to process an original audio signal input thereto to impart at least one of various effects to the input audio signal and output the processed audio signal, the method comprising:
    an audio signal processing step of causing the audio signal processor to process an original audio signal input thereto to impart the at least one of various effects to the input audio signal;
    a bypass step of transferring the original audio signal without being processed by the audio signal processor;
    a gain adjustment step of performing gain adjustment for the original audio signals transferred through the bypass step;
    a gain setting step of setting a gain used for the gain adjustment performed by the gain adjustment step in accordance with a ratio of input and output signal levels of the audio signal processor; and
    a control step of selecting and outputting at least one of the audio signal processed by the audio signal processor and the audio signal having the gain adjusted by the gain adjustment step, and
    wherein the control step normally selects the audio signal processed by the audio signal processor, while the control step temporarily selects the audio signal having the gain adjusted by the gain adjustment step instead of the audio signal processed by the audio signal processor when the audio signal processor is given an effect change command.

9. A non-transitory machine-readable storage medium containing a group of instructions executable by a processor to perform a method for processing audio signals using an audio signal processor which is configured to process an original audio signal input thereto to impart at least one of various effects to the input audio signal and output the processed audio signal, the method comprising:
    an audio signal processing step of causing the audio signal processor to process an original audio signal input thereto to impart the at least one of various effects to the input audio signal;
    a bypass step of transferring the original audio signal without being processed by the audio signal processor;
    a gain adjustment step of performing gain adjustment for the original audio signals transferred through the bypass step;
    a gain setting step of setting a gain used for the gain adjustment performed by the gain adjustment step in accordance with a ratio of input and output signal levels of the audio signal processor; and a control step of selecting and outputting at least one of the audio signal processed by the audio signal processor and the audio signal having the gain adjusted by the gain adjustment step, and wherein the control step normally selects the audio signal processed by the audio signal processor, while the control step temporarily selects the audio signal having the gain adjusted by the gain adjustment step instead of the audio signal processed by the audio signal processor when the audio signal processor is given an effect change command.

10. An audio device comprising:
an audio signal processor configured to process an original audio signal input thereto to impart at least one of various effects to the input audio signal, and output the processed audio signal;
a bypass channel configured to transfer the original audio signal without being processed by the audio signal processor;
a gain adjustment circuit provided in the bypass channel;
a gain setting circuit configured to set a gain of the gain adjustment circuit in accordance with a ratio of input and output signal levels of the audio signal processor; and
an output controller configured to select output signals from at least one of the audio signal processor and the bypass channel,
wherein the gain setting circuit includes a weighting circuit having frequency characteristics corresponding to an equal-loudness curve, and
wherein the gain setting circuit sets the gain of the gain adjustment circuit of the bypass channel in accordance with a rate of levels of first and second signals, the first signal having been obtained by processing the original audio signal by means of the weighting circuit, the second signal having been obtained by processing an output signal of the audio signal processor by means of the weighting circuit.

11. A computer-implemented method for processing audio signals using an audio signal processor which is configured to process an original audio signal input thereto to impart at least one of various effects to the input audio signal and output the processed audio signal, the method comprising:
an audio signal processing step of causing the audio signal processor to process an original audio signal input thereto to impart the at least one of various effects to the input audio signal;
a bypass step of transferring the original audio signal without being processed by the audio signal processor;
a gain adjustment step of performing gain adjustment for the original audio signals transferred through the bypass step;
a gain setting step of setting a gain used for the gain adjustment performed by the gain adjustment step in accordance with a ratio of input and output signal levels of the audio signal processor; and
a control step of selecting and outputting at least one of the audio signal processed by the audio signal processor and the audio signal having the gain adjusted by the gain adjustment step,
wherein the gain setting step includes a step of performing a weighting function having frequency characteristics corresponding to an equal-loudness curve, and
wherein the gain setting step sets the gain used for the gain adjustment performed by the gain adjustment step in accordance with a rate of levels of first and second signals, the first signal having been obtained by processing the original audio signal by means of the step of performing the weighting function, the second signal having been obtained by processing an output signal of the audio signal processor by means of the step of performing the weighting function.

12. A non-transitory machine-readable storage medium containing a group of instructions executable by a processor to perform a method for processing audio signals using an audio signal processor which is configured to process an original audio signal input thereto to impart at least one of various effects to the input audio signal and output the processed audio signal, the method comprising:
an audio signal processing step of causing the audio signal processor to process an original audio signal input thereto to impart the at least one of various effects to the input audio signal;
a bypass step of transferring the original audio signal without being processed by the audio signal processor;
a gain adjustment step of performing gain adjustment for the original audio signals transferred through the bypass step;
a gain setting step of setting a gain used for the gain adjustment performed by the gain adjustment step in accordance with a ratio of input and output signal levels of the audio signal processor; and
a control step of selecting and outputting at least one of the audio signal processed by the audio signal processor and the audio signal having the gain adjusted by the gain adjustment step,
wherein the gain setting step includes a step of performing a weighting function having frequency characteristics corresponding to an equal-loudness curve, and
wherein the gain setting step sets the gain used for the gain adjustment performed by the gain adjustment step in accordance with a rate of levels of first and second signals, the first signal having been obtained by processing the original audio signal by means of the step of performing the weighting function, the second signal having been obtained by processing an output signal of the audio signal processor by means of the step of performing the weighting function.

* * * * *